United States Patent [19]
Uesugi et al.

[11] Patent Number: 5,388,123
[45] Date of Patent: Feb. 7, 1995

[54] DATA RECEIVING SYSTEM

[75] Inventors: Mitsuru Uesugi; Kazuhisa Tsubaki; Kouichi Honma, all of Yokohama, Japan

[73] Assignee: Matsushita Electric Industrial Co., Ltd., Osaka, Japan

[21] Appl. No.: 871,810

[22] Filed: Apr. 21, 1992

[30] Foreign Application Priority Data

May 10, 1991 [JP] Japan .................. 3-105992

[51] Int. Cl.6 .................................. H03K 5/159
[52] U.S. Cl. ............................ 375/14; 333/18; 375/99; 375/102
[58] Field of Search .................. 375/11–14, 375/34, 58, 99–102; 364/724.19, 724.2; 333/18, 28 R

[56] References Cited

U.S. PATENT DOCUMENTS

| 4,245,320 | 1/1981 | Desblache | 375/12 |
| 4,555,788 | 11/1985 | Merrill | 375/11 |
| 4,669,091 | 5/1987 | Nossen | 375/102 |
| 4,797,898 | 1/1989 | Martinez | 375/12 |
| 5,097,482 | 3/1992 | Serizawa et al. | 375/14 |

FOREIGN PATENT DOCUMENTS

0166555A3 1/1986 European Pat. Off.

OTHER PUBLICATIONS

Fujitsu Scientific and Technical Journal, vol. 22, No. 4, Sep. 1986, Kawasaki, JP, pp. 294–306.
Nakajima et al, "Configuration of Decision Feedback Equalizer for Frequency Selective Fading Channel," 1989 Spring National Conventional Record, The Institute of Electronics, Information and Communication Engineers [Part 2] Communications Electronics, pp. 2-308, Mar. 28-31, 1989.
Raith et al, "Multi-Path Equalization for Digital Cellular Radio Operating at 300 KBIT/S," 36th IEEE Vehicular Technology Conference, pp. 232, 268-272, May 20-22, 1986, Dallas, TX.
D'Avella et al "Adaptive Equalization in TDMA Mobile Radio Systems," 37th IEEE Vehicular Technology Conference, pp. 385-392 Jun. 1-3, 1987, Tampa, Fla.
Uesugi et al, "Adaptive Equalization in TDMA Digital Mobile Radio," IEEE Global Telecommunications Conference & Exhibition, 1989 Conference Record, vol. 1 of 3 pp. 95-101, Nov. 27-30, 1989, Dallas, Tex.

Primary Examiner—Stephen Chin
Assistant Examiner—Don Vo
Attorney, Agent, or Firm—Stevens, Davis, Miller & Mosher

[57] ABSTRACT

According to the present invention, a large compensation effect can be obtained in a small operation volume regardless of which one of a distortion due to a frequency selective fading and a distortion due to an interference of adjacent waves is ruling. In the present invention, a principal wave signal and signals of channels adjacent to both sides of said principal wave are taken out, and power of these signals is compared to select either one of the fractional interval equalizer and the linear decision feedback equalizer.

13 Claims, 4 Drawing Sheets

DATA RECEIVING SYSTEM

BACKGROUND OF THE INVENTION

The present invention relates to a data receiving system to be used for a portable digital telephone set, a car digital telephone set or the like.

Portable telephone systems have been progressively digitalized in the recent years, and development of digital data receiving units has been promoted. Under this circumstance, the use of equalizers in the portable telephone systems is now essential and unavoidable in Europe. Since portable telephone sets are driven by batteries, it is necessary to develop receiving units requiring small power consumption. Therefore, development of data receiving units including equalizers with less operation for signal processing is more important.

Conventional data receiving units will be explained below.

FIG. 1 shows a structure of the main part of the conventional data receiving unit. In FIG. 1, 21 designates a receiving antenna, 22 a receiving filter and 23 an equalizer.

Operation of the above prior-art example will be explained. Referring to FIG. 1, a signal received by the receiving signal 21 is processed by the receiving filter 22 so that a signal of only a desired channel is taken out. This extracted signal becomes an equalizer input 25 and is inputted to the equalizer 23. The equalizer 23 removes a distortion of a transmission path from the signal outputted from the receiving filter 22 and outputs a received data 24 with small error. When the signal is being transmitted after having been modulated by the MSK (Minimum Shift Keying) system or the GMSK (Gaussian-filtered Minimum Shift Keying) system or the like, T, which is the time necessary for transmitting a one-bit signal, becomes T=(1/transmission rate).

Configuration examples of the equalizer used for the above data receiving unit will be explained below with reference to FIGS. 2A to 2C. FIG. 2A shows an example of a fractional interval equalizer. FIG. 2B shows an example of a linear decision feedback equalizer, and FIG. 2C shows an example of a fractional interval decision feedback equalizer. In each of these drawings, 26 designates a delay unit (T/2), 27 a delay unit (T), 28 an amplifier, 29 an adder and 30 a discriminator. A number of taps and an interval of the fractional interval equalizer are different depending on the conditions under which these units are used.

The fractional interval equalizer will be explained. In FIG. 2A, the equalizer input 25 is first applied to the delay units 26 and is stored in a delay line of a fractional interval. The equalizer input is then weighted to compensate for a distortion of a transmission path by the amplifier 28, and is added together by the adder 29. A plus or minus value of an output from the adder 29 is discriminated by the discriminator 30 so that the received data 24 with small error is produced. Since this equalizer has fractional intervals for taps, or tap intervals are sampled in fine fractions, it is possible to handle data of a wide range. Therefore, this equalizer can compensate not only for a distortion due to a multipulse frequency selective fading but also for a fading due to an interference of adjacent waves.

The linear decision feedback equalizer will be explained below. In FIG. 2B, the operation of the equalizer is the same as the operation of the equalizer in FIG. 2A, except that the forward side of the equalizer, or the portion above the adder 29 in FIG. 2B, has a symbolic interval (T) for the delay quantity of the delay unit 27. At the backward side of the equalizer, or at the portion below the adder 29, the received data 24 is stored in the delay unit 27, weighted by the amplifier 28 and is added by the adder 29. Since this equalizer has the backward side, it can reduce error rates of the received data 24 further than an equalizer having only the fractional interval equalizer or the forward side, for a frequency selective fading (when the delayed wave is smaller than the main wave). However, this equalizer can not compensate a distortion due to an interference of adjacent waves.

Next, the fractional interval decision feedback equalizer will be explained. In FIG. 2C, the operation of the forward side is the same as the operation of the fractional interval equalizer shown in FIG. 2A, and the operation of the backward side is the same as the operation of the linear decision feedback equalizer shown in FIG. 2B. Since this equalizer has the backward side, this has the same performance as that of the equalizer in FIG. 2B for a frequency selective fading. Further, since the forward side of this equalizer has fractional intervals, this equalizer can compensate a distortion due to an interference of adjacent waves.

However, according to the above-described prior-art data receiving units, there are the following problems. The fractional interval equalizer is inferior to the decision feedback equalizer in the performance for a frequency selective fading, the linear decision feedback equalizer can not compensate a distortion due to an interference of adjacent waves, and the fractional interval decision feedback equalizer has a large volume of operation because of a large total number of taps involved.

SUMMARY OF THE INVENTION

It is an object of the present invention to provide an excellent data receiving unit which can compensate, in a predetermined small operation volume, both a distortion due to a frequency selective fading and a distortion due to an interference of adjacent waves.

In order to achieve the above object, the data receiving unit of the present invention includes receiving filters for taking out a signal of a principal wave and signals of channels adjacent to both sides of the principal signal from a received signal, an equalizer having a fractional interval equalizer and a linear decision feedback type equalizer to remove a distortion of a transmission path from the received signal taken out from the receiving filters, and an equalizing controller for comparing power of the signals of the principal wave and each of the adjacent channels to select either one of the fractional interval equalizer and the linear decision feedback equalizer.

With the above structure, the data receiving unit of the present invention can select the linear decision feedback equalizer when the distortion due to the frequency selective fading is ruling and can select the fractional interval equalizer when the distortion due to the interference of the adjacent waves is ruling, so that the data receiving unit can compensate for both the distortion due to the frequency selective fading and the distortion due to the interference of the adjacent waves, in a predetermined small operation volume.

DESCRIPTION OF THE PREFERRED EMBODIMENT

Figure 1:
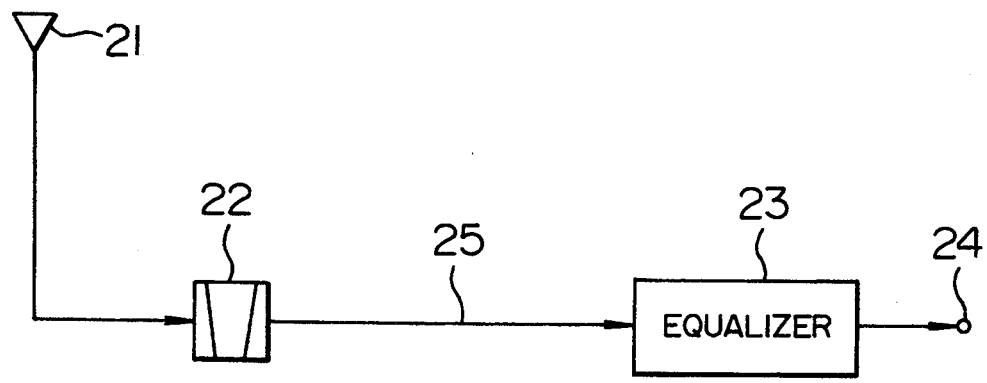
FIG. 1 is a block diagram for showing the main part of the conventional data receiving unit.
Figure 3:
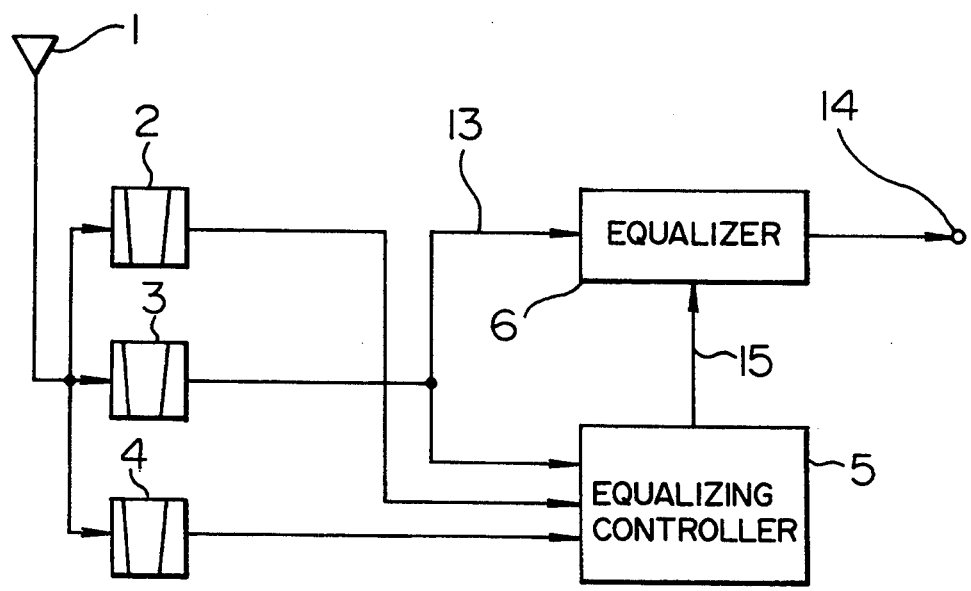
FIG. 3 is a block diagram for showing the main part of the data receiving unit according to one embodiment of the present invention.
Figure 4:
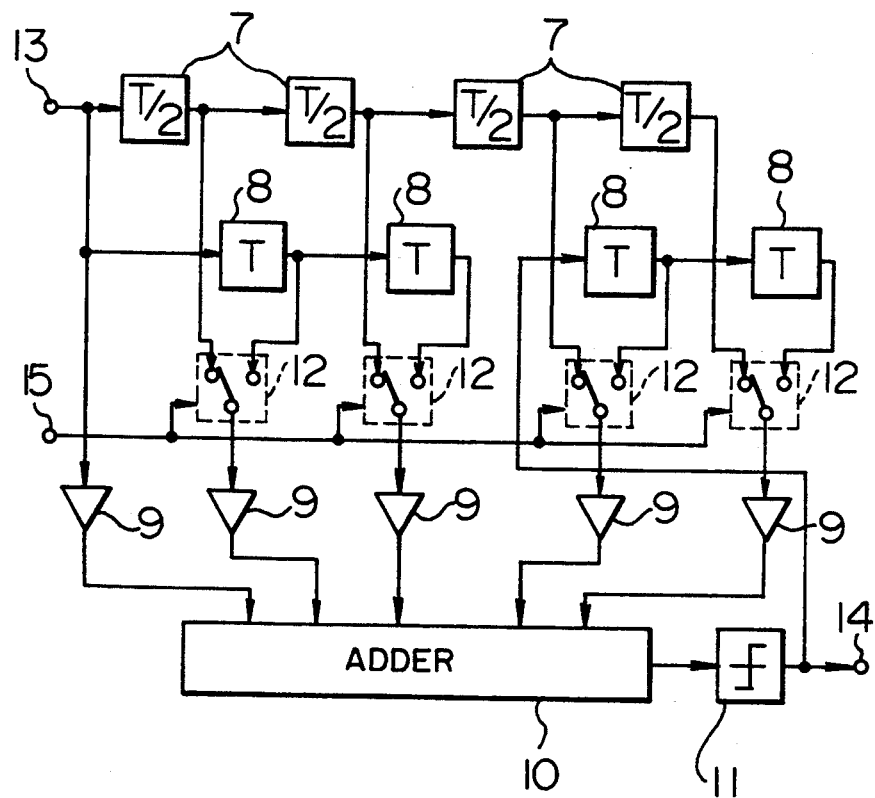
FIG. 4 is a block diagram for showing the equalizer according to the present embodiment.

FIG. 3 shows the configuration of one embodiment of the present invention. Referring to FIG. 3, 1 designates a receiving antenna and 2, 3 and 4 designate receiving filters. The receiving filter 2 takes out a signal (adjacent wave A) of the frequency higher than the frequency of the principal wave, the receiving filter 3 takes out the principal wave and uses its output as an equalizer input 13, and the receiving filter 4 takes out a signal (adjacent wave B) of the channel of the frequency lower than the frequency of the principal wave. 5 designates an equalizing controller which compares power of the signals taken out by the receiving filters 2, 3 and 4 respectively and controls an equalizer 6. The equalizer 6 includes a fractional interval equalizer and a linear decision feedback equalizer which are structured by delay units (T/2) 7, delay units (T) 8, amplifiers 9, an adder 10 and a discriminator 11, both the fractional interval equalizer and the linear decision feedback equalizer being capable of being selectively changed over by a selective switch 12, as shown in FIG. 4. In FIG. 4, 14 designates received data and 15 designates an equalizing control signal.

The operation of the above embodiment will be explained with reference to FIGS. 3 to 5C. In FIGS. 3 and 4, when a signal has been received by the receiving antenna 1, a signal (adjacent wave A) of the channel with a higher frequency than the frequency of the principal wave is taken out by the receiving filter 2, and this signal is inputted to the equalizing Controller 5. The principal wave is taken out by the receiving filter 3 and is applied as the equalizer input 13 to both the equalizer 6 and the equalizing controller 5. A signal (adjacent wave B) of the channel with a lower frequency than the frequency of the principal wave is taken out by the receiving filter 4 and is applied to the equalizing controller 5. The equalizing controller 5 then compares the power of these three kinds of signals and selectively decides whether the equalizer 6 is to be used as the fractional interval equalizer using the delay unit 7 or the equalizer 6 is to be used as the linear decision feedback equalizer using the delay unit 8. According to the present embodiment, the power of the adjacent wave A and the power of the adjacent wave B are added together as the total power of the adjacent waves, and this total power of the adjacent waves is compared with the power of the principal wave.

Figure 5A:
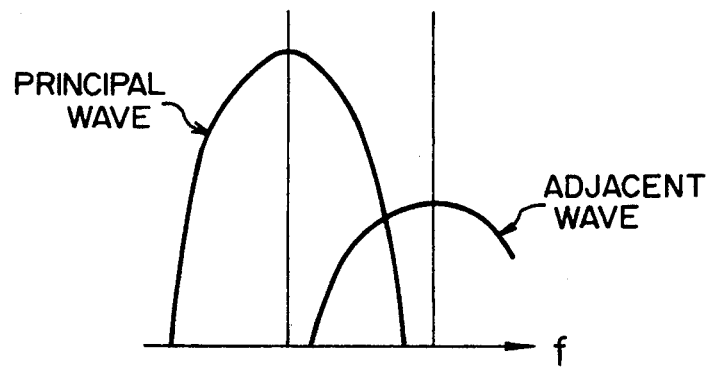
FIGS. 5A to 5C are frequency spectrum diagrams for showing the relationship between the principal wave and the adjacent waves, to explain the operation of the present embodiment.
Figure 5B:
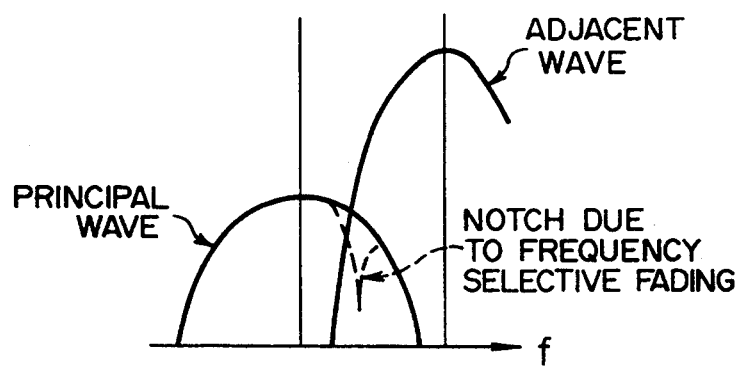
Figure 5C:
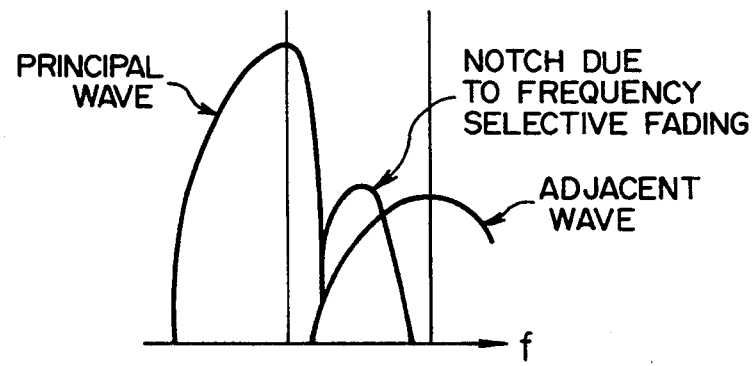

When there is no distortion due to a frequency selective fading and a distortion due to the adjacent waves is small, as shown in FIG. 5A, power of the adjacent waves is small and, therefore, the linear decision feedback equalizer is selected. When a distortion due to the adjacent waves is ruling and there is no distortion due to a frequency selective fading (or when a distortion due to the adjacent waves is overwhelmingly large although there is a distortion due to a frequency selective fading), as shown in FIG. 5B, the fractional interval equalizer is selected. When a distortion due to a frequency selective fading is ruling because a distortion due to the adjacent waves is small as shown in FIG. 5C, the linear decision feedback equalizer is selected as is the case in FIG. 5A. The result of a selection is informed to the equalizer 6 by the equalizing control signal 15, and the selective switch 12 of the equalizer 6 is controlled.

The equalizer input 13 is stored in the delay lines of the fractional intervals and symbolic intervals (T) by the delay units (T/2) 7 and the delay units (T) 8 in the equalizer 6. Data from each tap is selected such that, when the fractional interval equalizer has been selected by the change-over of the selective switch 12 based on the equalizing control signal 15, data from the delay line of fractional intervals is selected, and when the linear decision feedback type equalizer has been selected, data from the delay line with symbolic intervals is selected. The selected data is then inputted to the amplifiers 9, is weighted to compensate for a distortion of a transmission path, and is added together by the adder 10. A plus or minus value of an output from the adder 10 is discriminated by the discriminator 11, and the result becomes the received data 14. When the linear decision feedback equalizer has been selected, the data becomes feedback data to the backward side. The received data 14 is then decoded.

As explained above, according to the present embodiment, the principal wave and adjacent waves A and B are taken out through the three kinds of receiving filters 2, 3 and 4 from the signal received by the receiving antenna 1. Based on the ratio of the power of these signals, the equalizing controller 5 selects the equalizer 6 to be used as the linear decision feedback equalizer when a distortion due to a frequency selective fading is ruling and selects the equalizer 6 to be used as the fractional interval equalizer when the influence of a distortion due to the adjacent waves is ruling. Therefore, there is an effect that both a distortion due to a frequency selective fading and a distortion due to an interference of the adjacent waves can be compensated in a predetermined small operation volume.

Figure 2A:
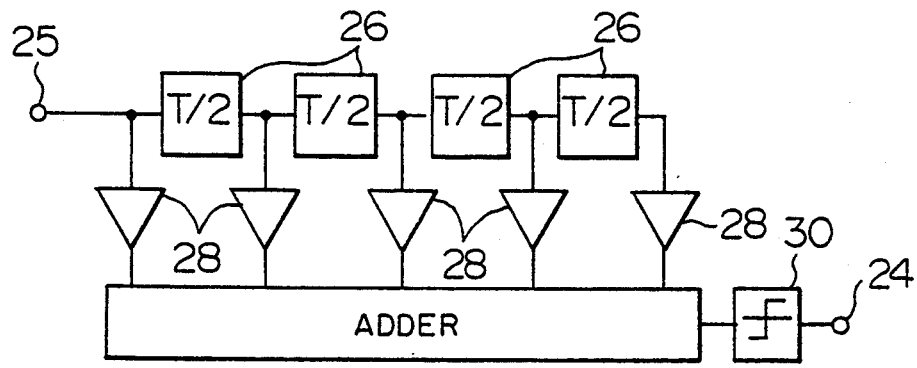
FIGS. 2A to 2C are block diagrams for showing examples of the equalizer used in the conventional data receiving unit.
Figure 2B:
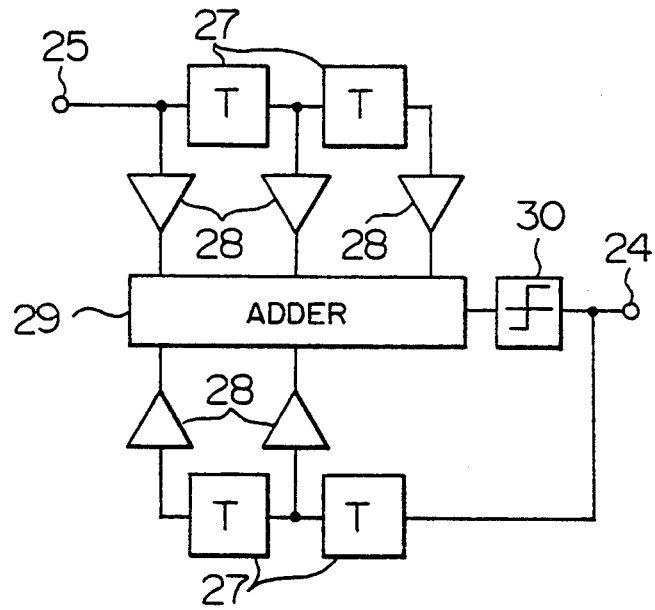
Figure 2C:
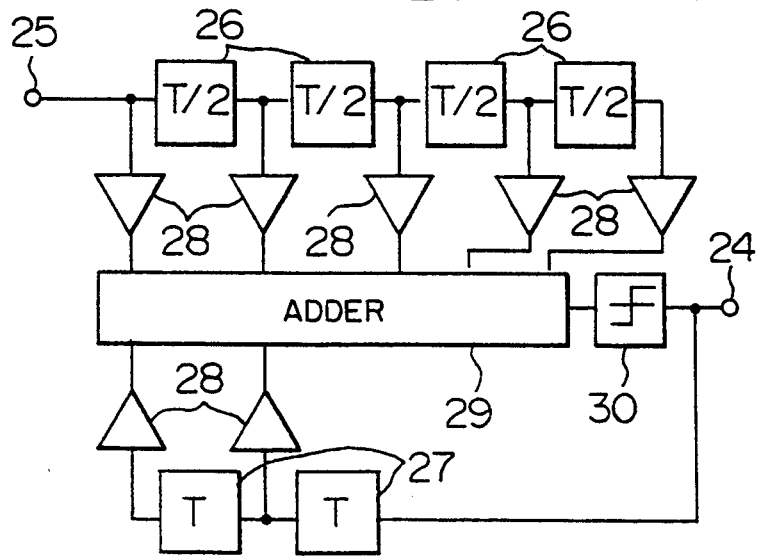
Figure 6:
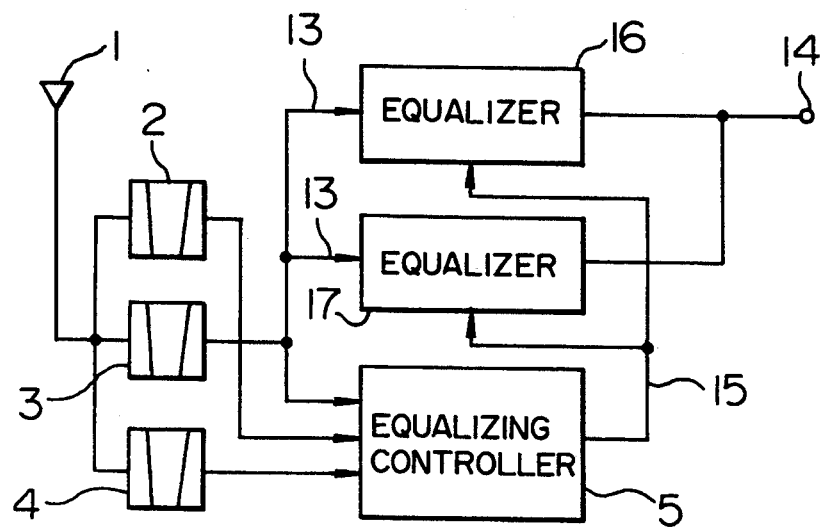
FIG. 6 is a diagram for showing another embodiment of the present invention.

Although the fractional interval equalizer and the linear decision feedback equalizer are integrally structured according to the present embodiment, the fractional interval equalizer 16 and the linear decision feedback equalizer 17 may be separately structured as shown in FIG. 6. In this case, the structure shown in FIG. 2A and the structure shown in FIG. 2B may be directly used as the fractional interval equalizer 16 and the linear decision feedback type equalizer 17 respectively.

We claim:

1. A data receiving system, comprising:
   a receiving filter for taking out from a received signal an output comprising a signal of a principal wave and signals of channels adjacent to said principal wave an equalizer for removing a distortion in a transmission path from at least a portion of said output by selectively performing one of fractional interval equalization and linear decision feedback equalization; and an equalizing controller for deciding, in accordance with said output, which one of said fractional interval equalization and said linear decision feedback equalization is to be performed by said equalizer.

2. A data receiving system according to claim 1, wherein said receiving filter comprises three receiving filter components, one of said three filter components corresponding to said principal wave and the other two of said receiving filter components corresponding to two of said channels adjacent to said principal wave respectively.

3. A data receiving system according to claim 1, wherein said equalizing controller comprises comparing means for performing a comparison operation including comparing a power of said signal of said principal wave and powers of said signals of said channels adjacent to said principal wave and said equalizing controller controls said equalizer to perform one of said fractional interval equalization in accordance with a result of said comparison operation and said linear decision feedback equalization in accordance with said result of said comparison operation.

4. A data receiving system according to claim 3, wherein said comparison operation includes comparing said power of said signal of said principal wave with a sum of said powers of said signals of said two adjacent channels.

5. A data receiving system, comprising:
a receiving filter for taking out from a received wave an output comprising a signal of a principal wave and signals of channels adjacent to said principal wave;

a fractional interval equalizer for removing a distortion in a transmission path from at least a portion of said output;

a linear decision feedback equalizer for removing said distortion in said transmission path from said at least a portion of said output; and an equalizing controller for selecting, in accordance with said output, one of said fractional interval equalizer and said linear decision feedback equalizer to use to remove said distortion in said transmission path.

6. A data receiving system according to claim 5, wherein said receiving filter comprises three receiving filter components, one of said three receiving filter components corresponding to said principal wave and the other two of said receiving filter components corresponding to two of said channels adjacent to said principal wave respectively.

7. A data receiving system according to claim 5, wherein said equalizing controller compares a power of said signal of said principal wave and powers of said signals of said channels adjacent to said principal wave to select either one of said fractional interval equalizer and said linear decision feedback equalizer.

8. A data receiving system according to claim 1, wherein said equalizer removes said distortion in said transmission path from said signal of said principal wave.

9. A data receiving system according to claim 8, wherein said equalizer comprises:
a plurality of fractional interval taps which receive said signal of said principal wave;

a plurality of linear decision feedback taps, at least a first subplurality of which receive said signal of said principal wave in parallel with said plurality of fractional interval taps;

a plurality of weighting amplifiers;

switching means for selectively connecting one of said plurality of fractional interval taps and said plurality of linear decision taps to said plurality of weighting amplifiers under a control of said equalizing controller;

an adder for adding outputs of said plurality of weighting amplifiers to obtain an added signal;

a discriminator for detecting a plus or minus value of said added signal to obtain a discriminated signal; and feedback means for feeding said discriminated signal back to at least a second subplurality of said plurality of linear decision taps;

whereby said equalizing controller controls said equalizer to function to perform either said fractional interval equalization or said linear decision feedback equalization in accordance with a state of said switching means.

10. A data receiving system according to claim 1, wherein one of said channels adjacent to said principal wave has a frequency higher than a frequency of said principal wave and another of said channels adjacent to said principal wave has a frequency lower than said frequency of said principal wave.

11. A data receiving system according to claim 5, wherein said one of said fractional interval equalizer and said linear decision feedback equalizer selected by said equalizing controller removes said distortion in said transmission path from said signal of said principal wave.

12. A data receiving system according to claim 5, wherein one of said channels adjacent to said principal wave has a frequency higher than a frequency of said principal wave and another of said channels adjacent to said principal wave has a frequency lower than said frequency of said principal wave.

13. A data receiving system according to claim 1, wherein said equalizer includes a first equalizer unit which performs said fractional interval equalization and a second equalizer unit which performs said linear decision feedback equalization.

* * * * *